United States Patent
Lee (10) Patent No.: US 7,098,712 B2
(45) Date of Patent: Aug. 29, 2006

(54) REGISTER CONTROLLED DELAY LOCKED LOOP WITH REDUCED DELAY LOCKING TIME

(75) Inventor: Jae-Jin Lee, Ichon-shi (KR)

(73) Assignee: Hynix Semiconductor, Inc., (KR)

( * ) Notice: Subject to any disclaimer, the term of this patent is extended or adjusted under 35 U.S.C. 154(b) by 52 days.

(21) Appl. No.: 10/858,976

(22) Filed: Jun. 1, 2004

(65) Prior Publication Data
US 2005/0001663 A1 Jan. 6, 2005

(30) Foreign Application Priority Data
May 31, 2003 (KR) .................. 10-2003-0035140

(51) Int. Cl.
*H03L 7/00* (2006.01)
(52) U.S. Cl. .................. 327/161; 327/152; 327/153; 377/64; 377/69
(58) Field of Classification Search .................. None
See application file for complete search history.

(56) References Cited

U.S. PATENT DOCUMENTS

| | | | |
|---|---|---|---|
| 6,194,930 B1* | 2/2001 | Matsuzaki et al. | 327/156 |
| 6,342,796 B1* | 1/2002 | Jung | 327/141 |
| 6,433,597 B1* | 8/2002 | Jung | 327/158 |
| 6,791,381 B1* | 9/2004 | Stubbs et al. | 327/156 |
| 6,828,835 B1* | 12/2004 | Cho | 327/158 |
| 2003/0108139 A1* | 6/2003 | Jung | 375/376 |
| 2003/0184355 A1* | 10/2003 | Lee | 327/158 |

* cited by examiner

*Primary Examiner*—Tuan T. Lam
(74) *Attorney, Agent, or Firm*—Blakely Sokoloff Taylor & Zafman (57) ABSTRACT

A register controlled delay locked loop includes a clock generation unit which receives an external clock signal for generating a source clock signal by buffering the external clock signal and for generating a delay monitoring clock signal and a reference clock signal by diving the source clock signal by a natural number; a delay line control unit which receives the reference clock signal and a feed-backed clock signal for generating a normal shift control signal and an acceleration shift control signal based on a result of a comparison between phases of the reference clock signal and the feed-backed clock signal; a delay line unit which receives the source clock signal for generating a delay locked clock signal by delaying the source clock signal according to a delay amount of the delay line unit determined by the normal shift control signal and the acceleration shift control signal; and a delay model unit for estimating a delay amount generated while the external clock signal is passed to a data output pin to generate the feed-backed clock signal, wherein an absolute delay amount based on the acceleration shift control signal is larger than that based on the normal shift control signal.

10 Claims, 11 Drawing Sheets

REGISTER CONTROLLED DELAY LOCKED LOOP WITH REDUCED DELAY LOCKING TIME

FIELD OF INVENTION

The present invention relates to a delay locked loop (DLL); and, more particularly, to a register controlled DLL for use in a semiconductor memory device.

DESCRIPTION OF PRIOR ART

Generally, a clock signal of a system or a circuit is used as a reference for synchronizing an execution timing and guaranteeing an error-free high speed operation.

When an external clock signal is inputted to a semiconductor memory device to be used as an internal clock signal, a clock skew is generated between the external clock signal and the internal clock signal because the external clock signal is delayed while it is inputted to the semiconductor memory device. Therefore, various devices have been introduced to synchronize the internal clock signal with the external clock signal.

For example, a phase locked loop (PLL) and a delay locked loop (DLL) have been developed in order to synchronize the internal clock signal with the external clock signal.

However, since the DLL is less influenced by a noise than the PLL, the DLL is widely used for a synchronous semiconductor memory such as a synchronous dynamic random access memory (SDRAM) or a double data rate (DDR) SDRAM. In particularly, a register controlled DLL which is a kind of a digital DLL is generally employed in the synchronous semiconductor memory device.

The register controlled DLL synchronizes a data output with the external clock signal by fore-reflecting a negative delay after receiving the external clock signal and compensating a delay value of data and clock signal paths.

Figure 1:
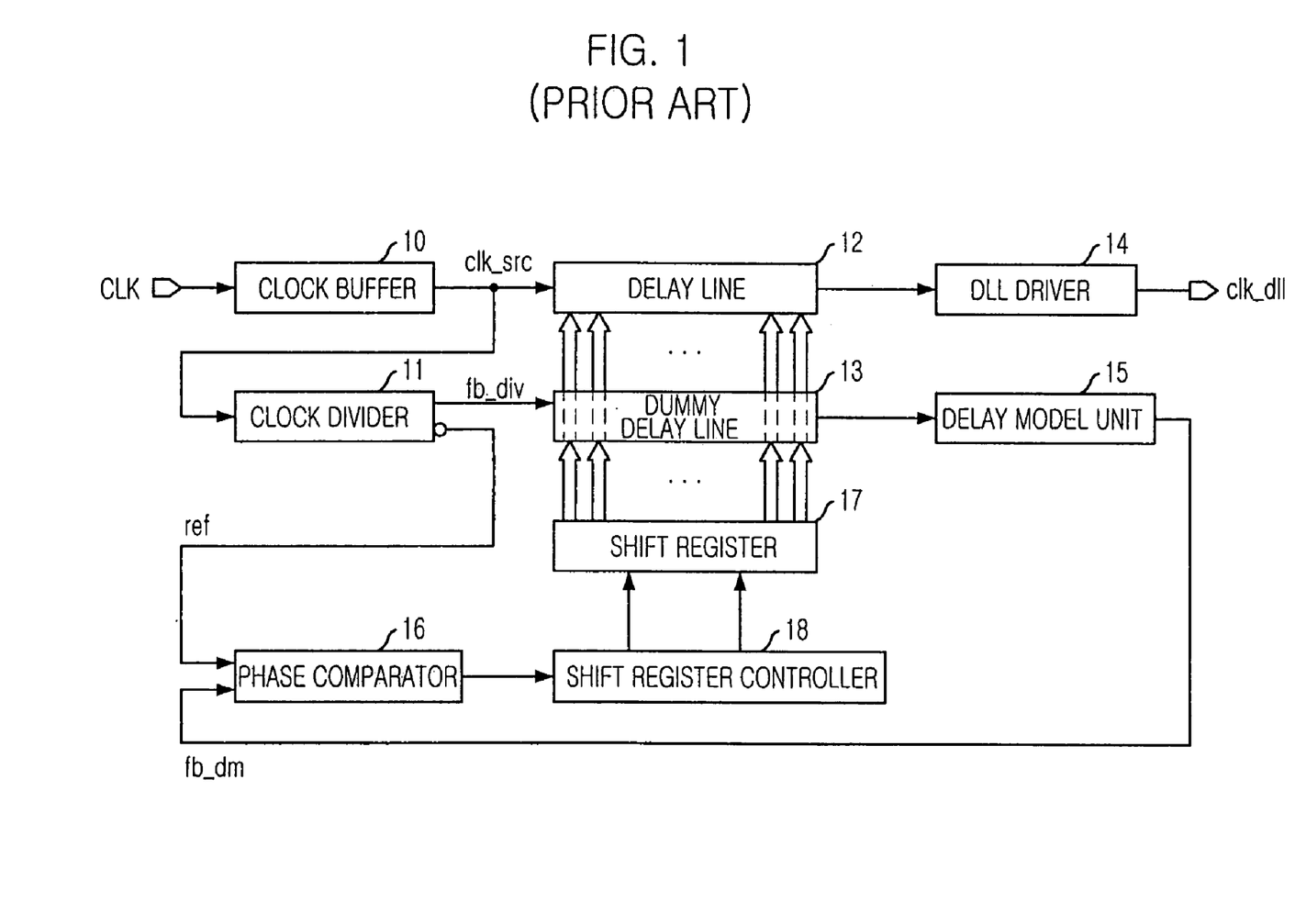
FIG. 1 is a block diagram showing a conventional register controlled DLL.

FIG. 1 is a block diagram showing a conventional register controlled DLL included in a conventional SDRAM.

As shown, the conventional register controlled DLL includes a clock buffer 10, a clock divider 11, a delay line 12, a dummy delay line 13, a DLL driver 14, a delay model unit 15, a phase comparator 16, a shift register 17 and a shift register controller 18.

The clock buffer 10 receives an external clock signal CLK to output a source clock clk_src which synchronizes with a rising edge or a falling edge of the external clock signal CLK.

The clock divider 11 divides the source clock clk_src by M to thereby generate a delay monitoring clock signal fb_div and a reference clock signal ref, where the M is a natural number.

The delay line 12 receives the source clock signal clk_src and includes a plurality of unit delays which are programmable. The dummy delay line 13 receives the delay monitoring clock signal fb_div and includes a plurality of unit delays which are programmable. Herein, the delay line 12 and the dummy delay line 13 are identical.

The shift register 17 serves to determine delay amount of the delay line 12 and the dummy delay line 13. The delay model unit 15 estimates a time delay generated while the external clock signal is passed to a data output pin (DQ pin) to thereby generate a feed-backed clock signal fb_dm.

The phase comparator 16 compares a phase of the feed-backed clock signal fb_dm with that of the reference clock signal ref and outputs the comparison result to the shift register controller 18. The shift register controller 18 generates a plurality of shit right control signals and shift left control signals based on the comparison result for controlling a shift direction of the shift register 17.

Herein, the delay model unit 15 has a same delay amount as that of the clock buffer 10, a data output buffer (not shown) and a clock signal line (not shown).

An operation of the conventional register controlled DLL is described below referring to FIG. 1.

The clock divider 11 generates the reference clock signal ref and the delay monitoring clock signal fb_div which are synchronized with the external clock signal CLK at an every Mth clock edge of the external clock signal CLK by dividing the source clock signal clk_src by M.

Generally, the reference clock signal ref and the delay monitoring clock signal fb_div have opposite phases, i.e., one of those two clock signals is an inverted signal of the other. However, the reference clock signal ref and the delay monitoring clock signal fb_div do not have to have opposite phase.

Meanwhile, the clock divider 11 is employed for reducing a power consumption of the conventional register controlled DLL and for simplifying a logic circuit when an operational frequency is increased. However, the clock divider 11 is not an indispensably required element of the conventional register controlled DLL.

At an initial state, the delay monitoring clock signal fb_div is passed through a single unit delay of the dummy delay line 13, and then is delayed for a predetermined delay time in the delay model unit 15.

Meanwhile, the phase comparator 16 compares a rising edge of the reference clock signal ref with that of the feed-backed clock signal fd_dm and outputs the comparison result to the shift register controller 18. The shift register controller 18 generates the shift right control signals and shift left control signals based on the comparison result to thereby control a shift direction of the shift register 17.

The shift register 17 controls delay amounts of the delay line 12 and the dummy delay line 13 by enabling one of the plurality of unit delays included in each of the delay line 12 and the dummy delay line 13 in response to the shift right control signals and shift left control signals.

Herein, if one of the shift right control signals is activated, a value of the shift register 17 shifted to right by one-bit and one-bit. On the other hand, if one of the shift left control signals is activated, the value of the shift register 16 is shifted to left by one-bit and one-bit.

Thereafter, the phase comparator 16 continues to compare phases of the feed-backed clock signal fd_dm and the reference clock signal ref until the two clock signals are synchronized. At this time, a delay locked clock signal clk_dll outputted from the DLL driver is synchronized with the external clock signal CLK, and a data output operation can be performed.

Figure 2:
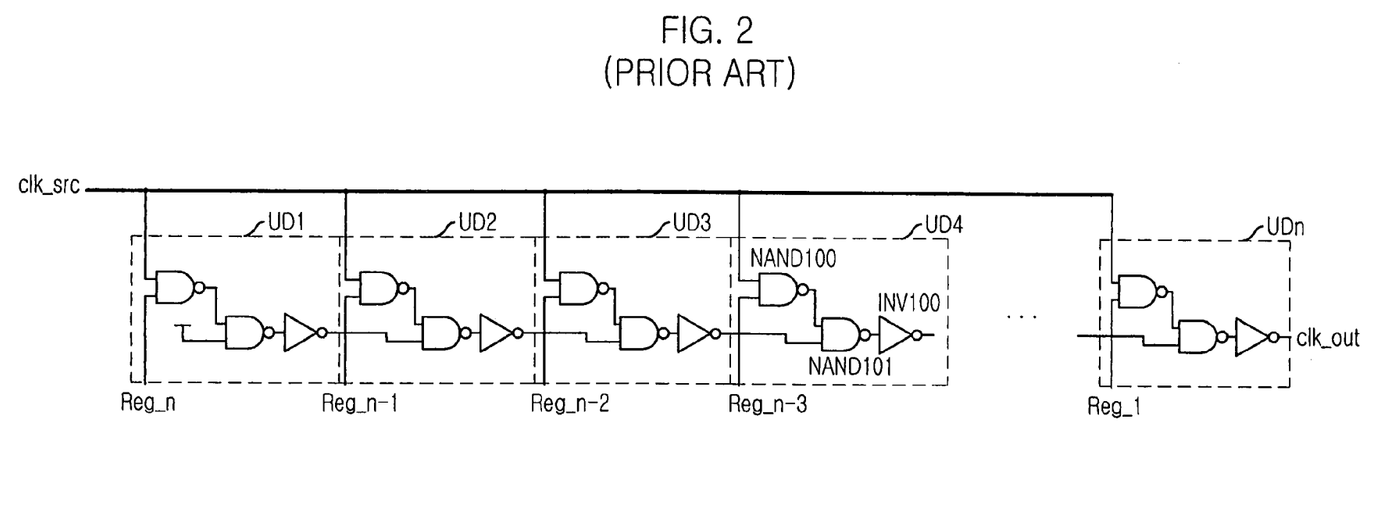
FIG. 2 is a schematic circuit diagram showing a delay line shown in FIG. 1.

FIG. 2 is a schematic circuit diagram showing the delay line 12. As mentioned above, a structure of the delay line 12 is the same as that of the dummy delay line 13.

As shown, the delay line 12 includes n numbers of unit delays UD1 to UD2, where n is a natural number.

Each of the n numbers of unit delays UD1 to UDn includes a first NAND gate NAND100, a second NAND gate NAND101 and a first inverter INV100.

The first NAND gate NAND100 receives the source clock signal clk_src and also receives one of n numbers of delay selection signals Reg_1 to Reg_n outputted from the shift register 17 for performing a logic NAND operation to the received signals.

The second NAND gate NAND101 receives output signals from the first NAND gate NAND100 and an inverter of a previous unit delay for performing a logic NAND operation to the received signals.

The inverter INV100 receives an output signal from the second NAND gate NAND101 and outputs the received signal to a second NAND gate of a next unit delay after buffering the received signal.

Herein, one input terminal of a second NAND gate of the unit delay UD1 is connected to a power supply voltage VDD.

An operation of the n numbers of unit delays UD1 to UDn is described below referring to the unit delay UD4.

If the delay selection signal Reg_n-3 is in a logic high level, the first NAND gate NAND100 outputs the source clock signal clk_src after inverting the source clock signal clk_src, and then the first NAND gate NAND100 outputs the source clock signal clk_src after inverting the source clock signal clk_src.

Thereafter, the second NAND gate NAND111 and the first inverter INV100 receives an output signal from the first NAND gate NAND100 to thereby output the received signal after delaying the received signal for a predetermined delay time.

On the other hand, if the delay selection signal Reg_n-3 is in a logic low level, an output signal of the first NAND gate NAND100 is in a logic high level regardless of a logic state of the source clock signal clk_src. Thereafter, the second NAND gate NAND111 and the first inverter INV100 delays an output signal from a previous unit delay, i.e., the unit delay UD3, for a predetermined delay time to thereby output the delayed signal to a next unit delay, i.e., the unit delay UD5.

Figure 3:
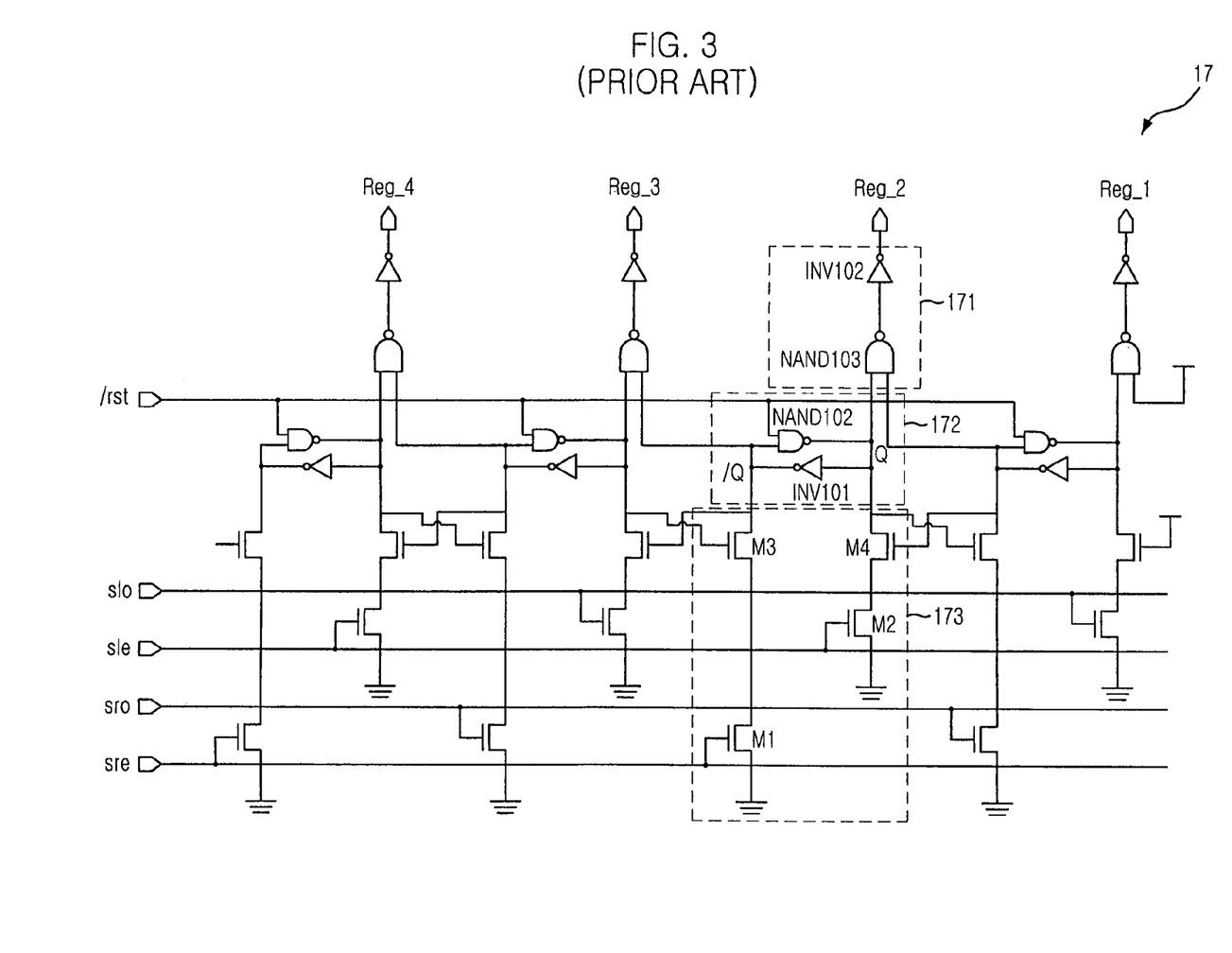
FIG. 3 is a schematic circuit diagram showing a shift register shown in FIG. 1.

FIG. 3 is a schematic circuit diagram showing the shift register 17 shown in FIG. 1.

As shown, the shift register 17 includes n numbers of circuit blocks each of which has a same structure.

Each of the n numbers of circuit blocks includes a logic combination unit 171, an inverting latch 172 and a switch unit 173.

The logic combination unit 171 includes a fourth NAND gate NAND103 and a third inverter INV102.

The fourth NAND gate NAND103 receives a main output Q from the inverting latch 172 and a sub output /Q from an inverting latch of a previous circuit block in order to perform a logic NAND operation to the received signals, and, thus outputs the result of the logic NAND operation as the register selection signal Reg_2 after inverting the result of the logic NAND operation at the third inverter INV102.

The inverting latch 172 includes a third NAND gate NAND102 for receiving a reset bar signal /rst and a sub output /Q to thereby output the main output Q; and also includes a second inverter INV101 for receiving the main output Q from the third NAND gate 102 in order to output the sub output /Q. Herein, at an initial state, all the main outputs Qs are in a logic high level.

The switch unit 173 serves to change a value stored in the inverting latch 172 in response to shift left control signals slo and sle and shift right control signals sro and sre.

The switch unit 173 includes first to fourth n-channel metal oxide semiconductor (NMOS) transistors M1 to M4.

The fourth NMOS transistor M4 is connected between the main output Q and the second NMOS transistor M2, and receives the sub output /Q from the previous circuit block through a gate of the fourth NMOS transistor M4. The third NMOS transistor M3 is connected between the second inverter 101 and the first NMOS transistor M1, and a gate of the third NMOS transistor M3 is connected to the sub output /Q of a next circuit block.

The first NMOS transistor M1 is connected between the third NMOS transistor M3 and a ground voltage, and a gate of the first NMOS transistor M1 receives the shift right control signal sre. The second NMOS transistor M2 is connected between the fourth NMOS transistor M4 and the ground voltage, and a gate of the second NMOS transistor M2 receives the shift left control signal sle.

Meanwhile, switch units included in the previous and the next circuit blocks receive the shift right control signal sre and the shift left control signal slo.

At an initial state, all of the inverting latches included in the shift register 17 have a same logic value, i.e., a value of a logic high level. Therefore, only the delay selection signal Reg_1 is in a logic high level, and the other delay selection signals Reg_2 to Reg_n are in a logic low level. Thereafter, under a control of the shift right control signals and the shift left control signals, one of the n numbers of delay selection signals Reg_1 to Reg_n becomes in a logic high level.

Figure 4:
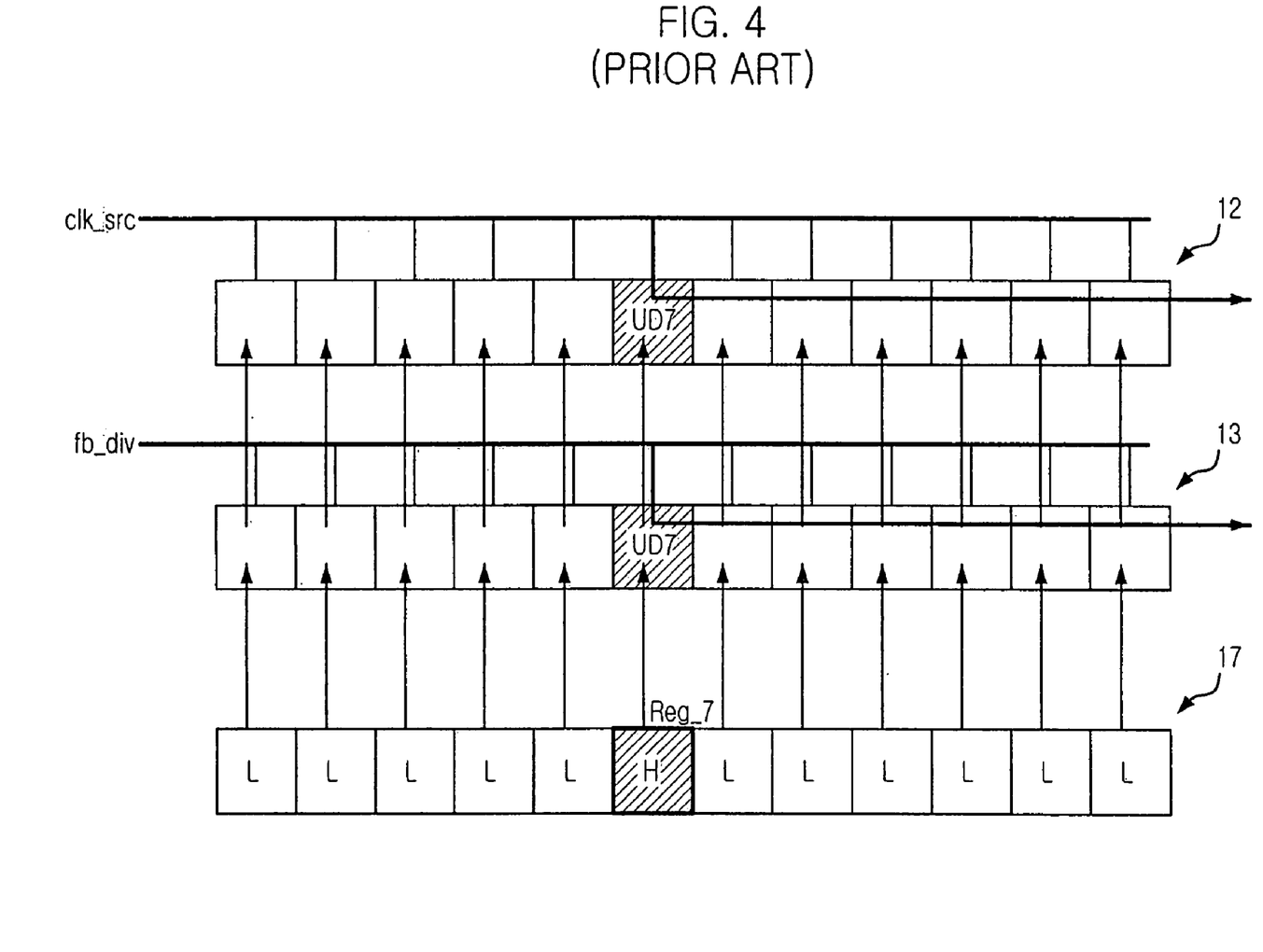
FIG. 4 is a diagram showing logic states of a delay line, a dummy delay line and a shift register shown in FIG. 1.

FIG. 4 is a diagram showing logic states of the delay line 12, the dummy delay line 13 and the shift register 17 under an assumption that the delay selection signal Reg_7 is in a logic high level.

As shown, in this case, the unit delay UD7 included in each of the delay line 12 and the dummy delay line 13 is enabled, and each of the source clock signal clk_src and the delay monitoring clock signal fb_div is inputted to the unit delay UD7 to be outputted from the delay line 12 and the dummy delay line 13 passing through the unit delays UD6 to UD1.

Figure 5:
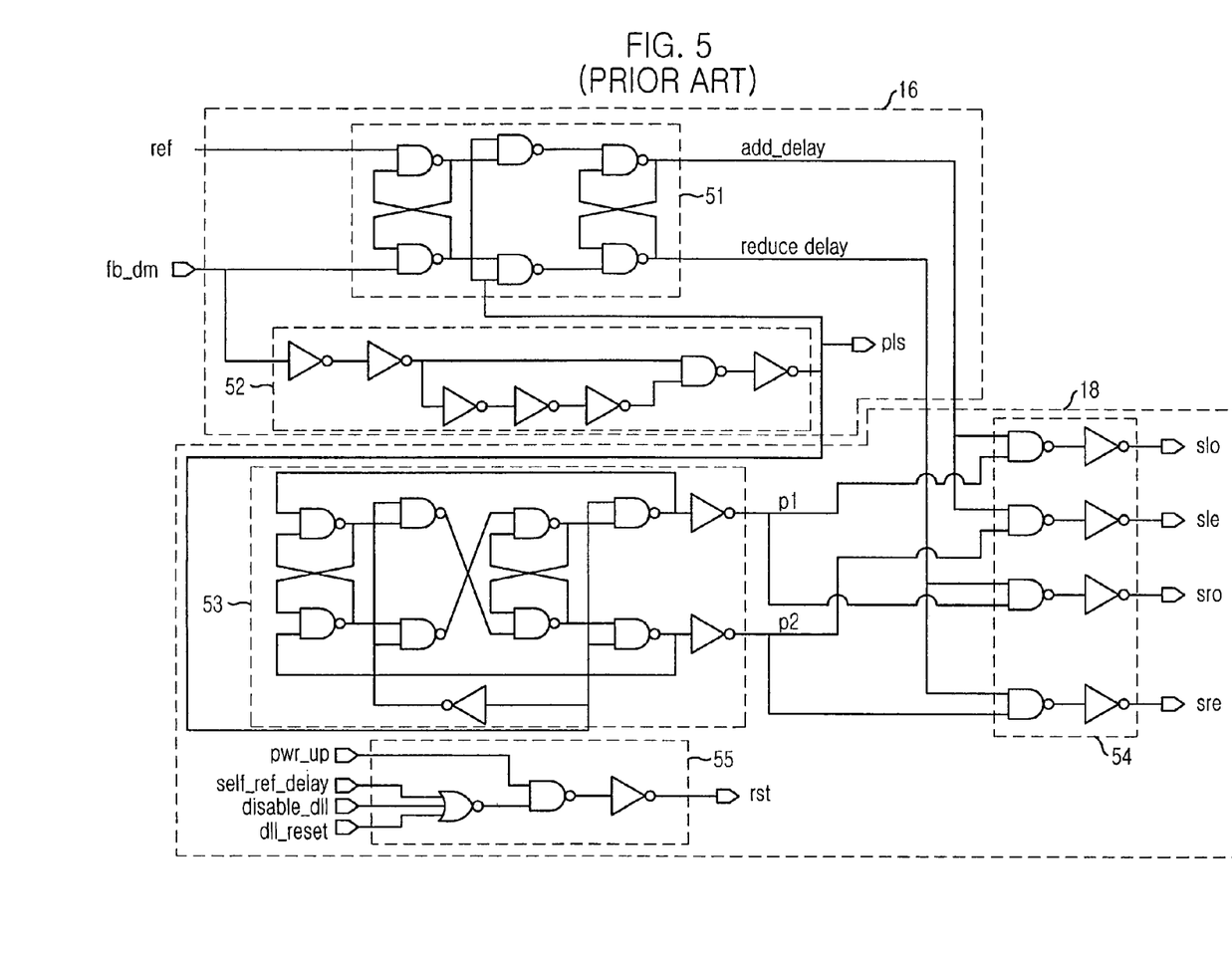
FIG. 5 is a schematic circuit diagram showing a phase comparator and a shift register controller shown in FIG. 1.

FIG. 5 is a schematic circuit diagram showing the phase comparator 51 and the shift register controller 18 shown in FIG. 1.

As shown, the phase comparator 16 includes an RS flip-flop circuit 16 and a pulse signal generator 52.

The pulse signal generator 52 receives the feed-backed clock signal fb_dm to thereby generate a pulse signal pls.

The RS flip-flop circuit 51 receives the pulse signal pls, the reference clock signal ref and the feed-backed clock signal fb_dm for comparing phases of the reference clock signal ref and the feed-backed clock signal fb_dm to thereby generate a first delay control signal add_delay and a second delay control signal reduce_delay.

The shift register controller 18 includes a T flip-flop circuit 53, a logic circuit unit 54 and a reset signal generator 55.

The reset signal generator 55 receives a power-up signal pwr_up, a self refresh signal self_ref_delay, a DLL disable signal disable_dll and a DLL reset signal dll_reset to thereby generate a reset signal rst for initializing the shift register 17.

The T flip-flop circuit 53 receives the pulse signal pls to generate a first and a second internal signals p1 and p2.

The logic circuit unit 54 receives the first and the second delay control signals add_delay and reduce_delay and the first and the second internal signals p1 and p2 in order to generate the shift control signals slo, sle, sro and sre by performing logic operations to the received signals.

Figure 6:
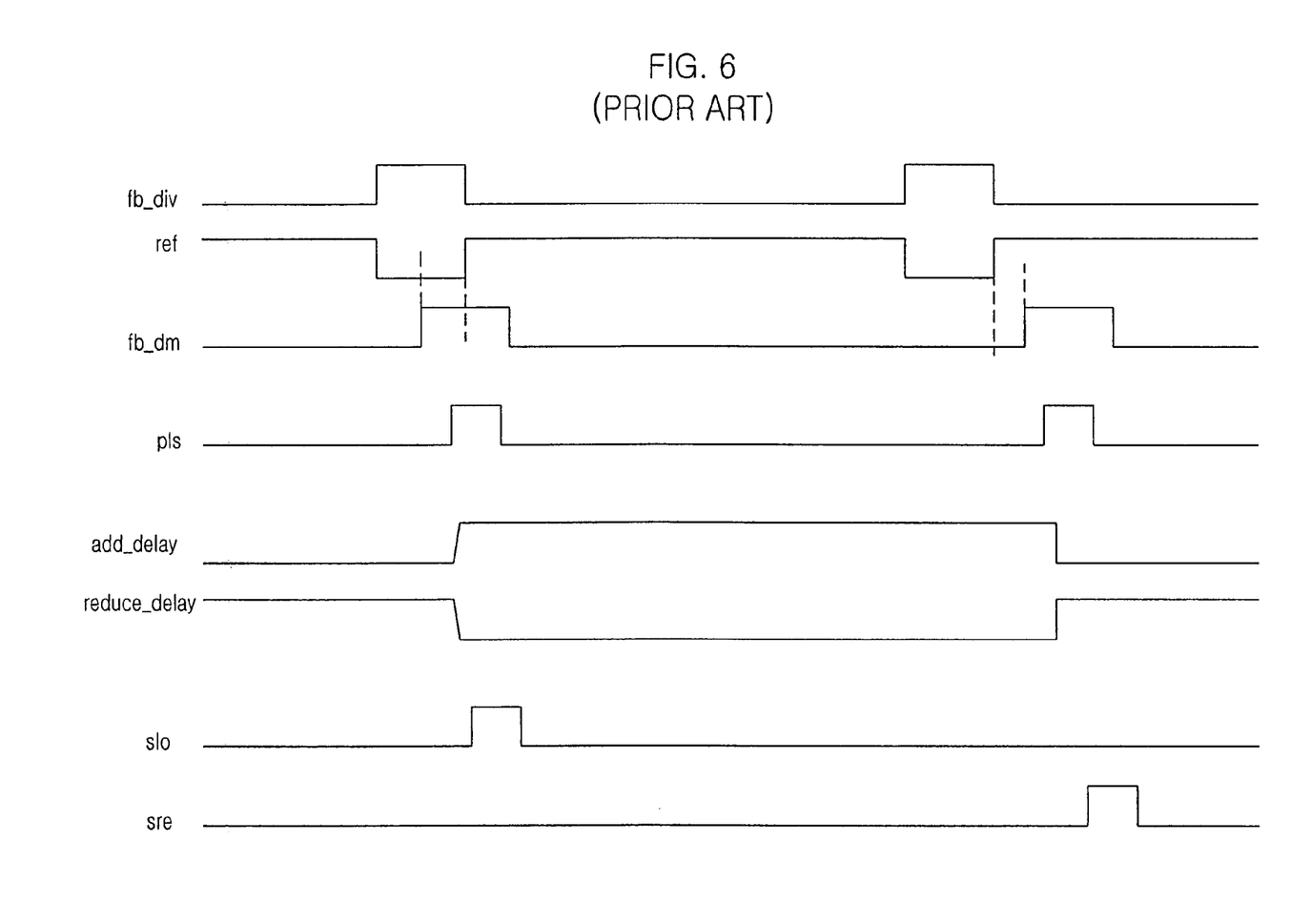
FIG. 6 is a timing diagram showing an operation of a shift comparator and a shift register controller shown in FIG. 1.

FIG. 6 is a timing diagram showing an operation of the shift comparator 16 and the shift register controller 18.

If a rising edge of the feed-backed clock signal fb_dm leads that of the reference clock signal ref, the first delay control signal add_delay is activated as a logic high level, and, thus the shift left control signal slo is activated. On the other hand, if a rising edge of the feed-backed clock signal fb_dm lags behind that of the reference clock signal ref, the second delay control signal reduce_delay is activated as a logic high level, and, thus the shift right control signal sre is activated.

Herein, when the shift left control signals slo and sle are activated as a logic high level, they are not overlapped. That is, when one of the shift left control signals slo and sle is in a logic high level, the other is in a logic low level. Likewise, the shit right control signals sro and sre are not overlapped.

Figure 7:
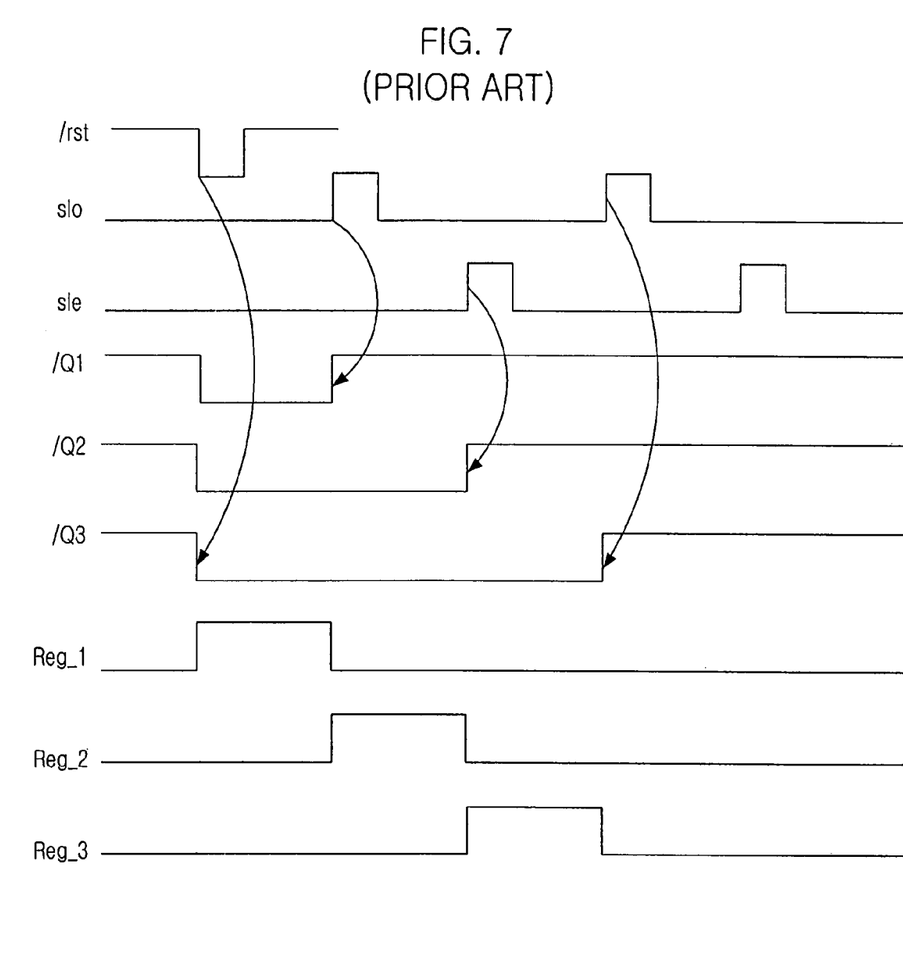
FIG. 7 is a timing diagram showing an operation of a shift register shown in FIG. 1.

FIG. 7 is a timing diagram showing an operation of the shift register 17.

The /Q1, /Q2 and /Q3 are sub outputs from a first to a third latch units respectively.

As shown, if an inverted signal of the reset signal rst, i.e., the reset bar signal /rst, becomes in a logic low level, all of the sub outputs /Q1, /Q2 and /Q3 become in a logic low level. Thereafter, as the shift left control signals slo and sle are activated as a logic high level in turn, the sub outputs /Q1, /Q2 and /Q3 become in a logic high level, and thus the delay selection signals Reg_1, Reg_2 and Reg_3 are activated one by one.

However, the conventional register controlled DLL needs a long time for delay locking after resetting the conventional register controlled DLL. For example, for shifting a unit delay by 100, 100 times of performing shift left operations are required.

Therefore, while the conventional register controlled DLL performs a delay locking operation consuming lots of time, a semiconductor memory device may be operated abnormally.

SUMMARY OF INVENTION

It is, therefore, an object of the present invention to provide a register controlled DLL capable of minimizing a delay locking time.

In accordance with an aspect of the present invention, there is provided a register controlled DLL including a clock generation unit which receives an external clock signal for generating a source clock signal by buffering the external clock signal and for generating a delay monitoring clock signal and a reference clock signal by diving the source clock signal by a natural number; a delay line control unit which receives the reference clock signal and a feed-backed clock signal for generating a normal shift control signal and an acceleration shift control signal based on a result of a comparison between phases of the reference clock signal and the feed-backed clock signal; a delay line unit which receives the source clock signal for generating a delay locked clock signal by delaying the source clock signal according to a delay amount of the delay line unit determined by the normal shift control signal and the acceleration shift control signal; and a delay model unit for estimating a delay amount generated while the external clock signal is passed to a data output pin to generate the feed-backed clock signal, wherein an absolute delay amount based on the acceleration shift control signal is larger than that based on the normal shift control signal.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a register controlled delay locked loop (DLL) in accordance with the present invention will be described in detail referring to the accompanying drawings.

Figure 8:
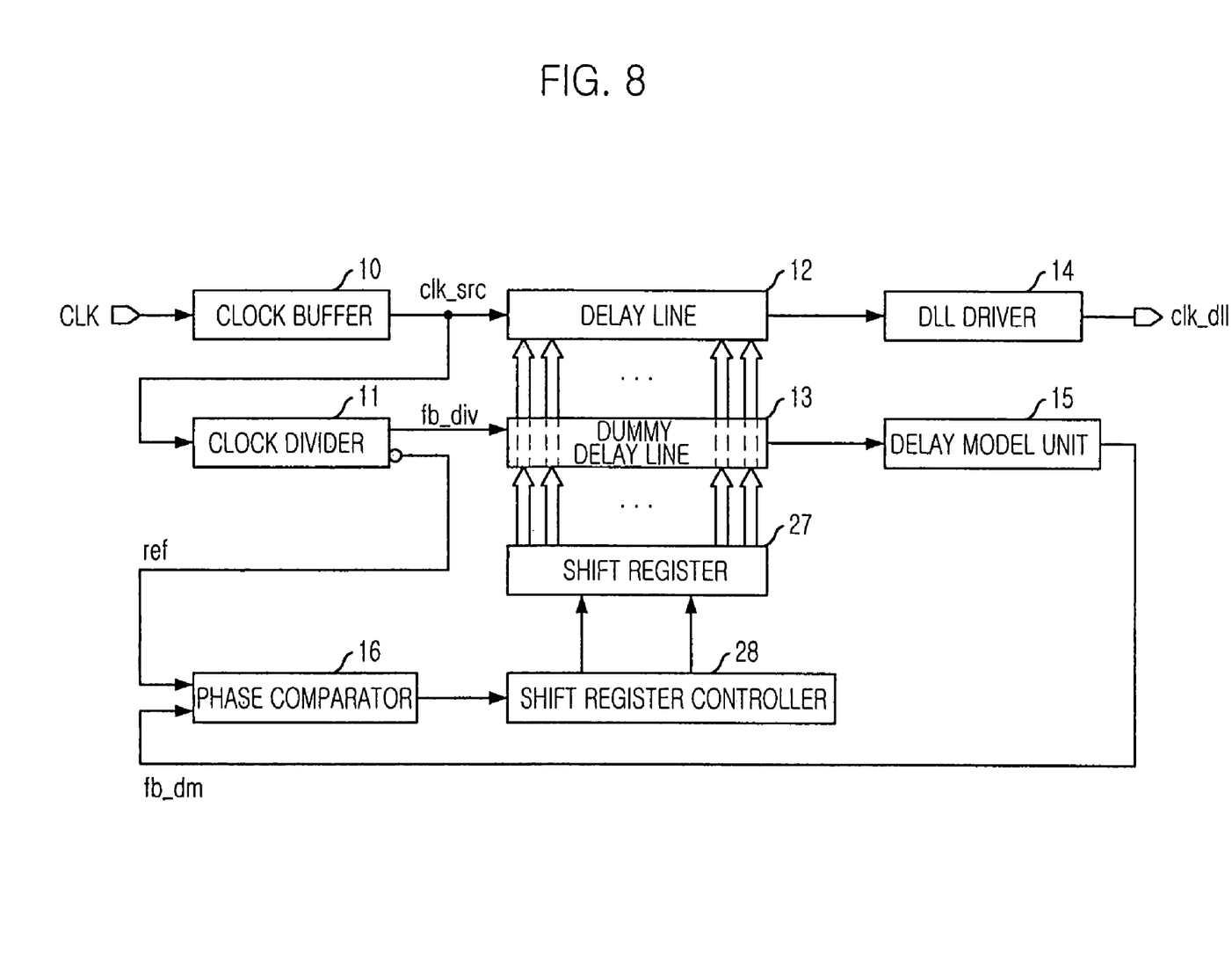
FIG. 8 is a block diagram showing a register controlled DLL in accordance with a preferred embodiment of the present invention.

FIG. 8 is a block diagram showing a register controlled DLL in accordance with a preferred embodiment of the present invention.

As shown, the register controlled DLL includes a clock buffer 10, a clock divider 11, a delay line 12, a dummy delay line 13, a DLL driver 14, a delay model unit 15, a phase comparator 16, a shift register 27 and a shift register controller 28.

The register controlled DLL has a same structure as that of the conventional register controlled DLL except for the shift register 27 and the shift register controller 28.

Figure 9:
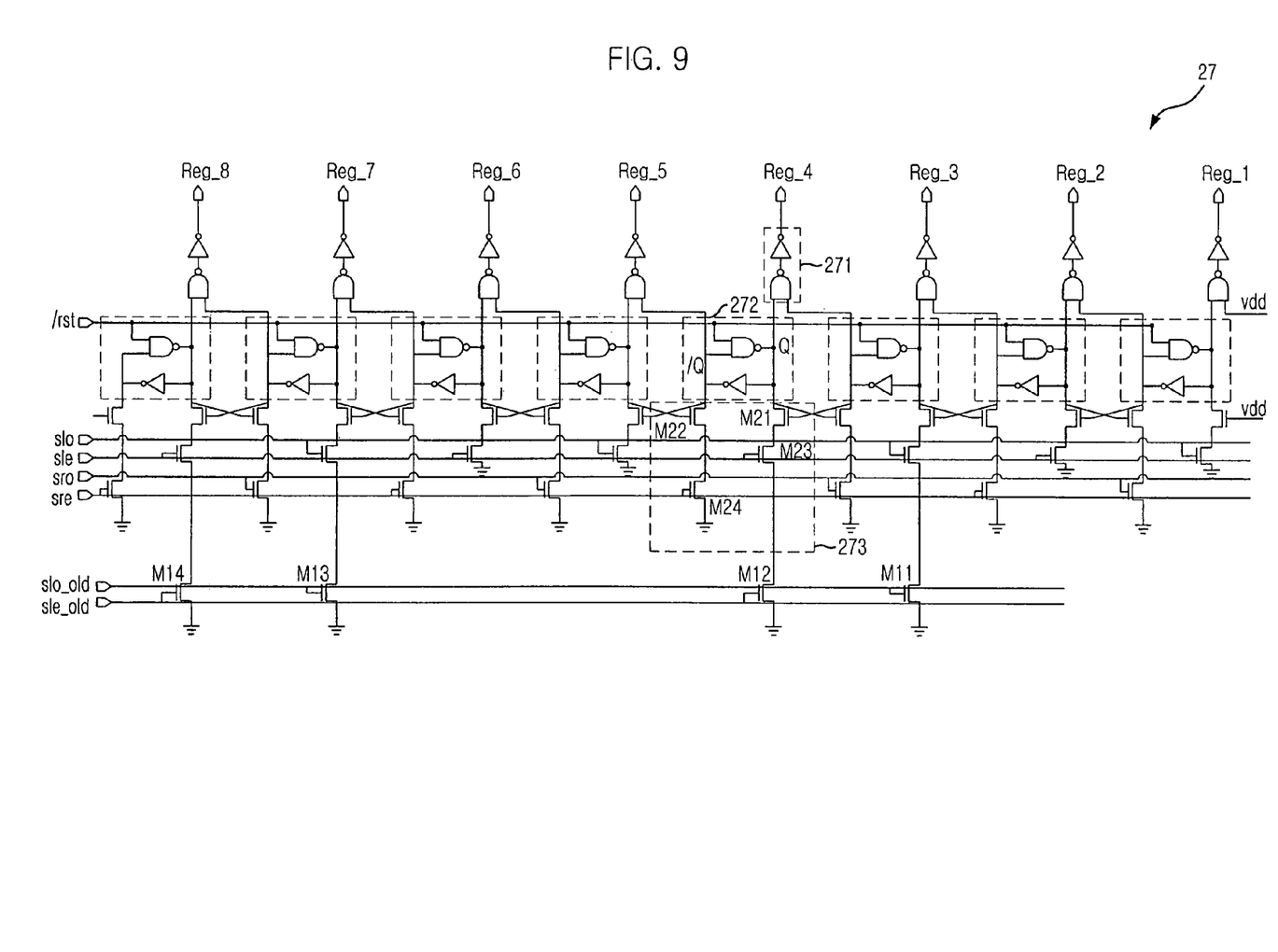
FIG. 9 is a schematic circuit diagram showing a shift register shown in FIG. 8.

FIG. 9 is a schematic circuit diagram showing the shift register 27 shown in FIG. 8.

As shown, the shift register 27 includes a plurality of circuit stages each of which includes a logic combination unit 271, an inverting latch 272 and a switch unit 273 to generate a plurality of delay selection signals Reg_1 to Reg_8 in response to a reset signal rst, acceleration shift left control signals slo and sle, shift right control signals sro and sre and shift left control signals slo_old and sle_old.

The shift register 27 further includes a plurality of n-channel metal oxide semiconductor (NMOS) transistors M11 to M14 for receiving the shift left control signals slo_old and sle_old to control the delay selection signals Reg_1 to Reg_8.

To explain a structure of the shift register 27, a fourth circuit stage which serves to generate the delay selection signal Reg_4 is described below.

A main output Q of the inverting latch 272 is connected to an NMOS transistor M21 and a sub output /Q of the inverting latch 272 is connected to an NMOS transistor M22. A gate of the NMOS transistor M21 is connected to a sub output /Q of an inverting latch included in a previous circuit stage, and a gate of the NMOS transistor M22 is connected to a main output Q of an inverting latch included in a next circuit stage.

An NMOS transistor M23 is connected to the NMOS transistor M21 and a gate of the NMOS transistor M23 is connected to the acceleration shift left control signal sle. An NMOS transistor M24 is connected to the NMOS transistor M22 and a gate of the NMOS transistor M24 is connected to the shift right control signal sre.

The NMOS transistor M12 is connected between a ground voltage and the NMOS transistor M23, and a gate of the NMOS transistor M12 is connected to the shift left control signal sle_old. The NMOS transistor M12 serves to discharge the main output Q in response to the shift left control signal sle_old.

Figure 10:
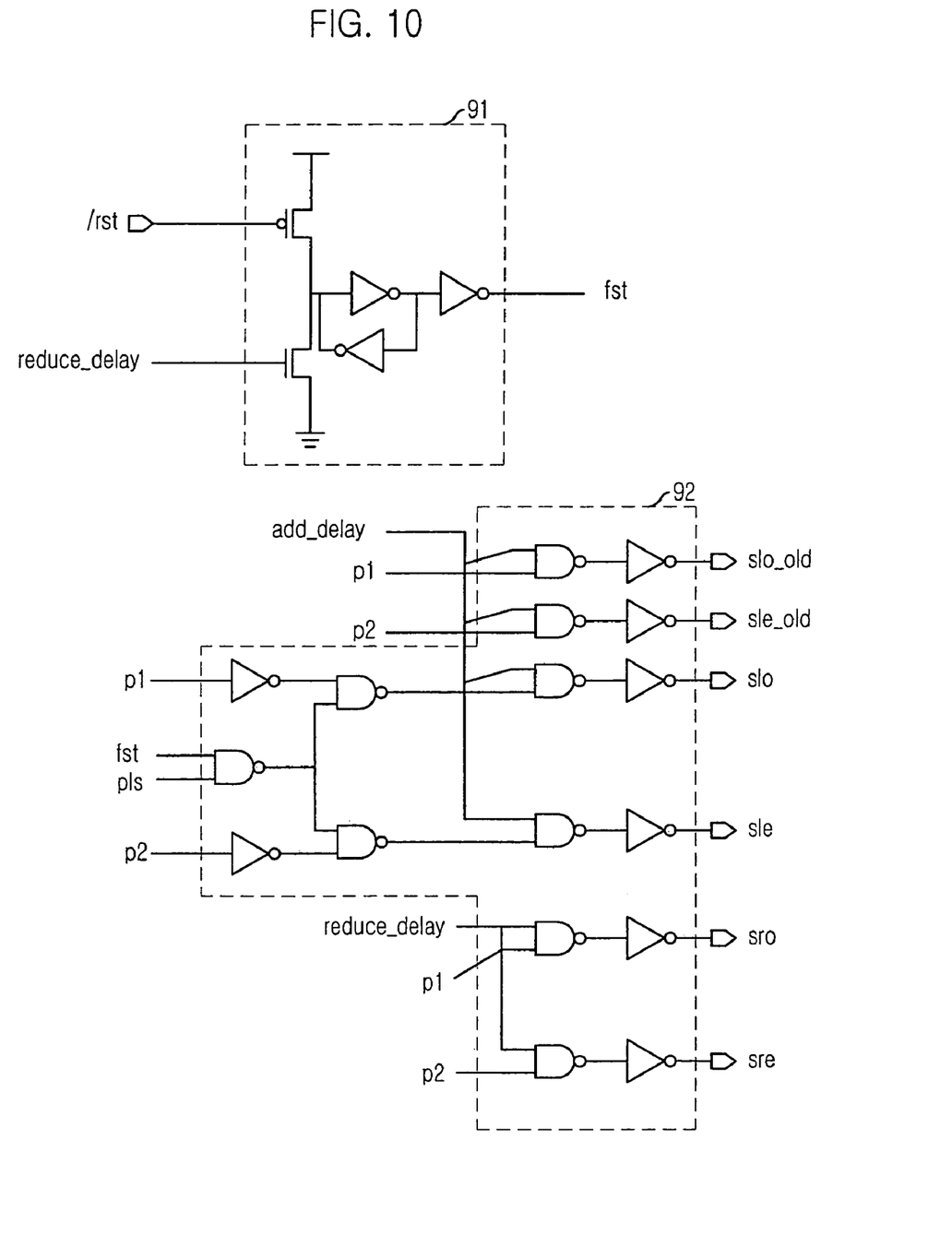
FIG. 10 is a schematic circuit diagram showing a shift register controller FIG. 8.

FIG. 10 is a schematic circuit diagram showing the shift register controller 28 shown in FIG. 8.

Contrary to a shift register controller of the conventional DLL shown in FIG. 1, the shift register controller 28 is described; and, especially, only different part of the shift register controller 18 included in the conventional DLL is shown in FIG. 9.

The shift register controller 28 includes the T flip-flop circuit 53 and the reset signal generator 55 shown in FIG. 5, and further includes an acceleration flag signal generator 91 and a logic circuit unit 92.

The acceleration flag signal generator 91 receives a reset bar signal /rst and a second delay control signal reduce_delay to thereby generate an acceleration flag signal fst.

The logic circuit unit 92 includes a plurality of NAND gates and inverters for generating the shift left control signals slo_old and sle_old, the acceleration shift left control signals slo and sle and the shift right control signals sro and sre in response to a first delay control signal add_delay, the second delay control signal reduce_delay, a first and a second internal signals p1 and p2, a pulse signal pls and the acceleration flag signal fst. Herein, the first and the second internal clock signals p1 and p2 and the first and the second delay control signals add_delay and reduce_delay are described in FIG. 5.

Figure 11:
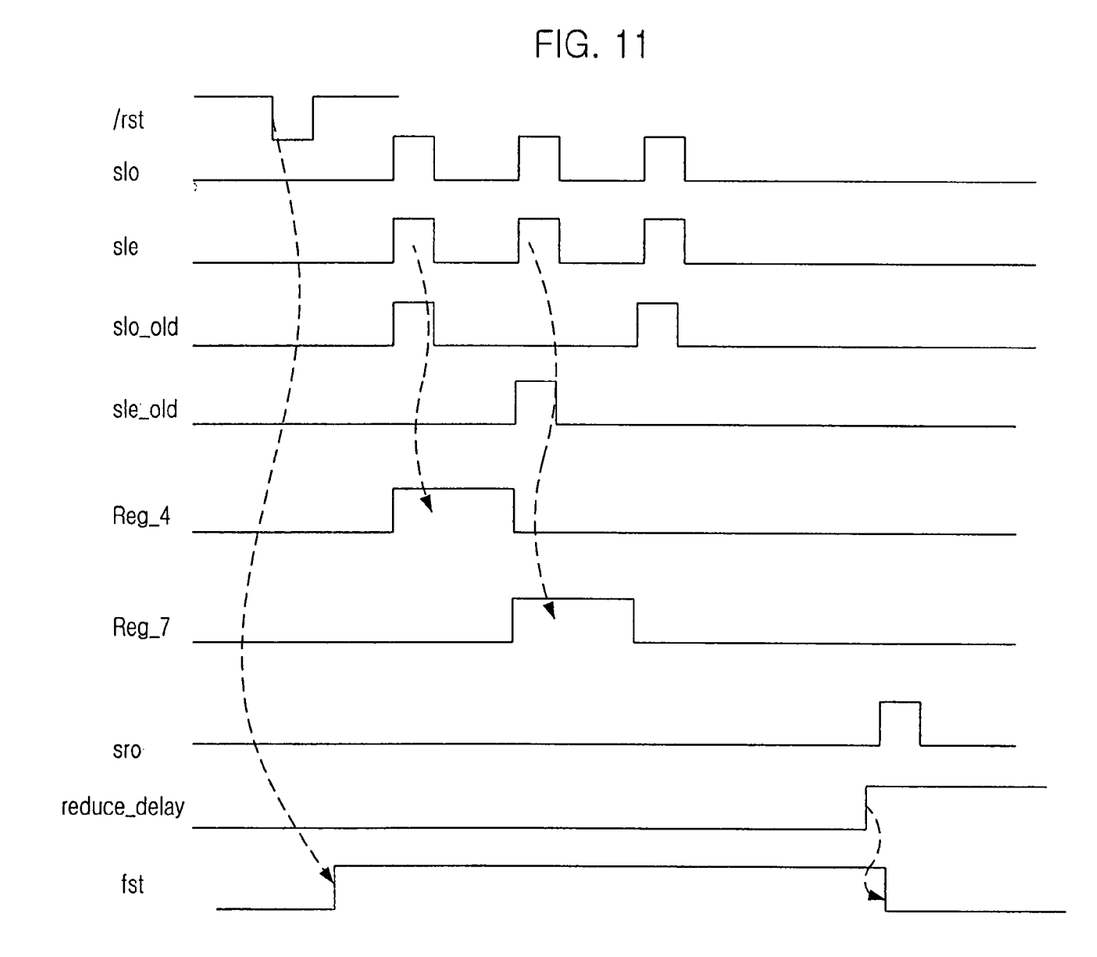
FIG. 11 a timing diagram showing an operation of a register controlled DLL in accordance with the present invention.

FIG. 11 a timing diagram showing an operation of the register controlled DLL.

Referring to FIGS. 8 to 11, the operation of the register controlled DLL is described below.

If the reset bar signal /rst is activated as a logic low level, all of the main output Qs of the shift register 27 become in a logic high level, and the acceleration flag signal fst is activated as a logic high level. As a result, only the delay selection signal Reg_1 is among the delay selection signals Reg_1 to Reg_8 is activated as a logic high level, and, thus a single unit delay included in a delay line and a dummy delay line is selected.

Thereafter, a rising edge of a reference clock signal ref is compared to a rising edge of a feed-backed clock signal fb_dm, then, the first delay control signal add_delay is activated as a logic high level based on the comparison result for increasing a delay amount of the delay line and the dummy delay line.

As a result, the acceleration shift left control signals slo and sle and the shift left control signal slo_old become in a logic high level.

Herein, the acceleration shift left control signals slo and sle are activated as a logic high level at the same time, and, thus the main outputs Qs of a first to a third inverting latch of the shift register 27 are discharged. As a result, the delay selection signals Reg_1 to Reg_3 are in a logic low level.

Meanwhile, since the shift left signals slo_old and sle_old are respectively inputted to the NMOS transistors M11 and M12, the delay selection signal Reg_4 becomes in a logic high level.

That is, in the conventional register controlled DLL, the delay selection signal Reg_2 is activated as a logic high level after the delay selection signal Reg_1 is activated as a logic high level at the initial state. However, unlike the conventional register controlled DLL, the delay selection signal Reg_4 is activated as a logic high level after the delay selection signal activated as a logic high level at the initial state. Therefore, the register controlled DLL in accordance with the present invention can control a delay amount of the delay line and the dummy delay line more fast than the conventional register controlled DLL.

Thereafter, if the first delay control signal add_delay stays in a logic high level based on the comparison result, the acceleration shift left control signals slo and sle and the shift left control signal sle_old become in a logic high level. As a result, the delay selection signal Reg_7 becomes in a logic high level.

The above-mentioned operation is continuously performed until the second delay control signal reduce_delay is activated as a logic high level.

If the second delay control signal reduce_delay is activated as a logic high level based on the comparison result, the acceleration flag signal fst is inactivated as a logic low level. Thereafter, logic values of the inverting latches of the shifter register 27 are shift-righted by one-bit in response to the shit right control signals sro and sre to determine an exact delay amount of the delay line and the dummy delay line. The above-mentioned operation is continuously performed until the reference signal ref and the feed-backed clock signal fb_dm are synchronized.

That is, at an initial state, the acceleration flag signal fst is in a logic high level, and a logic value of a right most unit delay of the delay line 12 is selected, i.e., the logic value of the right most unit delay becomes in a logic high level so that the delay line 12 can have a minimum delay amount. Thereafter, if the delay line 12 is required to have a more delay amount based on the comparison result of the phase comparator 16, the logic value of the right most unit delay which is in a logic high level is shifted left by plural-bits. If the delay line 12 is still required to have a more delay amount based on the comparison result, a logic value of a unit delay which is in a logic high level is shifted left again by plural bits.

Thereafter, if the delay line 12 is required to reduce a delay amount, the second delay control signal reduce_delay is activated as a logic high level, whereby the acceleration flag signal fst inactivated as a logic low level.

Therefore, a logic value of a unit delay which is in a logic high level is shifted right by one-bit in response to the shift right control signals sre and sro in order to reduce a delay amount of the delay line 12.

The above-mentioned operation is continuously performed until the reference clock signal ref and the feed-backed clock signal fb_dm are synchronized.

Herein, in case of the conventional register controlled DLL, a logic value of a unit delay is shifted left by one-bit to increase a delay amount of the delay line 12. Therefore, the register controlled DLL in accordance with the present invention can increase a delay amount of the delay line 12 more fast than the conventional register controlled DLL.

As described above, the register controlled DLL in accordance with the present invention can save a delay locking time by controlling a delay amount of a delay line at a high speed. As a result, a performance of a semiconductor memory device can be increased by using the register controlled DLL.

The present application contains subject matter related to Korean patent application No. 2003-35140, filed in the Korean Patent Office on May 31, 2003, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A register controlled delay locked loop (DLL) for generating a delay locked clock signal comprising:
a clock generation unit which receives an external clock signal for generating a source clock signal by buffering the external clock signal and for generating a delay monitoring clock signal and a reference clock signal by diving the source clock signal by a natural number;
a delay line unit which receives the source clock signal for generating the delay locked clock signal by delaying the source clock signal according to a delay amount of the delay line unit determined by a normal shift control signal and an acceleration shift control signal;
a phase comparator for comparing phases of the reference clock signal and a feed-backed clock signal for outputting a comparison result;
a shift register for generating a plurality of delay selection signals in response to the normal shift control signal and the acceleration shift control signal to thereby controls the delay amount of the delay line unit;
a shift register controller for generating the normal shift control signal and the acceleration shift control signal based on the comparison result; and
a delay model unit for estimating a delay amount generated while the external clock signal is passed to a data output pin to generate the feed-backed clock signal, wherein an absolute delay amount based on the acceleration shift control signal is larger than that based on the normal shift control signal.

2. The register controlled DLL as recited in claim 1, wherein the absolute delay amount based on the acceleration shift control signal is four times larger than that based on the normal shift control signal.

3. The register controlled DLL as recited in claim 2, wherein the delay amount of the delay line unit is always increased by the acceleration shift control signal.

4. The register controlled DLL as recited in claim 3, wherein the normal shift control signal includes a normal shift left control signal for left-shifting the delay amount by one-bit and a normal shift right control signal for right-shifting the delay amount by one-bit.

5. The register controlled DLL as recited in claim 4, wherein the clock generation unit includes:
a clock buffer for buffering the external clock signal to thereby generate the source clock signal; and
a clock divider which receives the source clock signal for generating the delay monitoring clock signal by dividing the source clock signal by the natural number.

6. The register controlled DLL as recited in claim 5, wherein the delay line unit includes:
a first delay line which receives the source clock signal for generating the delay locked clock signal by delaying the source clock signal based on the normal shift control signal and the acceleration shift control signal; and
a second delay line which receives the delay monitoring clock signal for delaying the delay monitoring clock signal based on the normal shift control signal and the acceleration shift control signal to thereby output the delayed signal to the delay model unit.

7. The register controlled DLL as recited in claim 6, wherein the phase comparator includes:
a T flip-flop which receives the reference clock signal and the feed-backed clock signal to thereby generate a first and a second delay control signals; and
a plurality of logic gates which receive the feed-backed clock signal for generating a pulse signal.

8. The register controlled DLL as recited in claim 7, wherein the shift register includes:
a plurality of circuit stages each of which selectively receives a reset signal, the normal shift control signal and the acceleration shift control signal to thereby activate one of the delay selection signals based on logic states of the reset signal, the normal shift control signal and the acceleration shift control signal; and
a circuit stage control unit for controlling logic states of the delay selection signals in response to the normal shift control signal.

9. The register controlled DLL as recited in claim 8, wherein the circuit stage control unit includes a plurality of NMOS transistors each of which selectively connected to one of the circuit stages.

10. The register controlled DLL as recited in claim 9, wherein the shift register controller includes:
a reset signal generator which receives a power up signal, a self refresh signal, a DLL disable signal and a DLL reset signal for generating the reset signal;
a T flip-flop circuit which receives the pulse signal for generating a first and a second internal clock signals;
an acceleration flag signal generator which receives the reset signal and one of the first and the second delay control signal for generating an acceleration flag signal; and
a logic circuit unit which receives the first and the second internal signals, the first and the second delay control signals, the feed-backed clock signal and the acceleration flag signal to thereby generate the shift control signals and the accelerated shift control signals.

* * * * *